United States Patent [19]
Lin et al.

[11] Patent Number: 5,615,150
[45] Date of Patent: Mar. 25, 1997

[54] CONTROL GATE-ADDRESSED CMOS NON-VOLATILE CELL THAT PROGRAMS THROUGH GATES OF CMOS TRANSISTORS

[75] Inventors: Jonathan Lin, Milpitas; Radu Barsan, Cupertino, both of Calif.

[73] Assignee: Advanced Micro Devices, Inc., Sunnyvale, Calif.

[21] Appl. No.: 551,974

[22] Filed: Nov. 2, 1995

[51] Int. Cl.$^6$ ................................................ G11C 11/34
[52] U.S. Cl. ................................ 365/185.17; 365/185.29
[58] Field of Search ........................ 365/185.29, 185.17, 365/189.05

[56] References Cited

U.S. PATENT DOCUMENTS 4,885,719  12/1989  Brahmbhatt ..................... 365/185.17
5,272,368  12/1993  Turner ............................. 365/189.05

*Primary Examiner*—Amir Zarabian
*Attorney, Agent, or Firm*—Davis Chin

[57] ABSTRACT

An improved control gate-addressed CMOS memory cell is provided which allows for programming and erasing by tunneling through the gate oxides of the PMOS and NMOS transistors. The CMOS memory cell (400) includes a PMOS transistor (402), an NMOS transistor (403), and an NMOS pass transistor (405). A capacitor (430) has a first terminal coupled to a common floating gate (416) of the PMOS and NMOS transistors and has a second terminal coupled to a control gate node.

18 Claims, 2 Drawing Sheets

CONTROL GATE-ADDRESSED CMOS NON-VOLATILE CELL THAT PROGRAMS THROUGH GATES OF CMOS TRANSISTORS

BACKGROUND OF THE INVENTION

1. Field of the Invention

This invention relates generally to non-volatile electrically erasable CMOS memory cells and more particularly, it relates to an improved control gate-addressed CMOS memory cell which allows for programming and erasing by tunneling through the gate oxides of the PMOS and NMOS transistors.

2. Description of the Prior Art

A conventional prior art CMOS memory cell having a PMOS transistor and an NMOS transistor with a common floating gate is illustrated and described in U.S. Pat. No. 4,885,719 to D. J. Brahmbhatt issued on Dec. 5, 1989, and in U.S. Pat. No. 5,272,368 to J. E. Turner et al. issued on Dec. 21, 1993, which are both herein incorporated by reference. In FIG. 1 of the drawings of the present application, there is shown a schematic of a CMOS memory cell which is similar to the one in either the '719 patent or the '368 patent.

The CMOS memory cell 100 is comprised of a complementary metal-oxide silicon (CMOS) electrically erasable ($E^2$) transistors. As can be seen, the source of the PMOS transistor 102 is connected to a first power supply VCC and the source of the NMOS transistor 104 is connected to a second power supply potential VSS. The drains of the two transistors 102 and 104 are connected together at a common node 124 which forms the output of the CMOS memory cell 100. The two CMOS transistors also have a common floating gate 126 which can be electrically programmed by the tunneling of electrons through a tunnel oxide separating the floating gate from a programming or write node 134. The tunnel oxide is represented by a capacitor 108. An NMOS transistor 110 supplies a word control (WC) voltage or programming potential to the capacitor 108 as controlled by a word line (WL) voltage applied to its gate. A capacitor 106 separates the floating gate 126 from an array control gate (ACG) node.

While the CMOS memory cell 100 utilizes essentially zero power when it is not changing states, it does suffer from the disadvantage of requiring a second capacitor 108 with a tunnel oxide region which thus requires additional amounts of space on the die. Moreover, since the second capacitor 108 includes n+ implant regions formed in a p type substrate and a gate oxide overlying the implant region, a programming junction region is required to be added to the substrate beneath the gate oxide in order to prevent depletion of the p type substrate during programming. Thus, the fabrication of the memory cell 100 involves additional steps according to known techniques on a silicon substrate.

Another prior art CMOS memory cell having a PMOS transistor and an NMOS transistor sharing a common floating gate is illustrated and described in application Ser. No. 08/427,117 entitled "A CMOS Memory Cell With Gate Oxide of Both NMOS and PMOS Transistors as Tunneling Window for Program and Erase" and filed on Apr. 21, 1995, in the names of Jonathan Lin and Bradley A. Sharpe-Geisler. This Ser. No. 08/427,117 is assigned to the same assignee as the present invention and is hereby incorporated by reference. In FIG. 2 of the drawings of the present application, there is shown a schematic of a CMOS memory cell 300 which is similar to the one in Ser. No. 08/427,117.

The CMOS memory cell 300 includes a PMOS transistor 302 and an NMOS transistor 304 which share a common floating gate 305. The drains of the transistors 302 and 304 are coupled together at a node 307 so as to form the output of the CMOS memory cell 300. The CMOS memory cell 300 further includes a single capacitor 306 connected to couple a voltage from an array control gate (ACG) node to the floating gate 305. A separate PMOS pass transistor 310 has its drain connected to the source of the PMOS transistor 302, its source connected to receive a word control (WC) voltage and its gate connected to receive a word line (WL) voltage.

In order to erase the CMOS memory cell 300, a voltage of +13.8 volts is applied to the array control gate (ACG) node of the capacitor 306 and the source of the NMOS transistor 304 is connected to a ground potential or zero volts. As a result, electrons will tunnel from the source of the transistor 304 through the gate oxide to the common floating gate 305. Further, a high impedance is applied to the source of the PMOS transistor 302 during erase to prevent depletion of its channel which would occur if the PMOS transistor 302 were biased to add electrons to the floating gate 305. Nevertheless, the CMOS cell 300 suffers from the disadvantage that it is still susceptible to a potential deep depletion related disturb problem. This is caused by the fact that even though the transistor 310 is turned off and isolates the WC voltage from the source of the transistor 302 the transistors 310 and 302 have the same substrate voltage. It is generally desired to have the transistor 302 in deep depletion in order for the cell to be not disturbed. Thus, if the voltage on the substrate is switched high, then the transistor 302 may come out of deep depletion too fast and go into an inversion so as to cause disturb by tunneling electrons through the gate oxide of the transistor 302.

The present invention represents a significant improvement over the aforementioned '719 and '368 patents and the application Ser. No. 08/427,117 so as to provide an improved CMOS memory cell having a smaller cell size than those traditionally available. This is achieved by utilizing a control gate node to address the PMOS and NMOS transistors in the memory cell so as to allow for both programming and erasing by tunneling through their gate oxides.

SUMMARY OF THE INVENTION

Accordingly, it is a general object of the present invention to provide an improved CMOS memory cell having a small cell size but yet overcomes the disadvantages of the prior art CMOS memory cells.

It is an object of the present invention to provide an improved CMOS memory cell which occupies a smaller amount of space on a die.

It is another object of the present invention to provide an improved CMOS memory cell which uses a smaller amount of power consumption.

It is still another object of the present invention to provide a control gate-addressed CMOS memory cell which allows for programming and erasing by tunneling through the gate oxides of the PMOS and NMOS transistors.

It is yet still another object of the present invention to provide an improved CMOS memory cell which utilizes a control gate to address a PMOS transistor for inverting and applying a programming voltage to its channel and an NMOS transistor for inverting and applying an erasing voltage to its channel.

In accordance with these aims and objectives, the present invention is concerned with the provision of an improved control gate-addressed CMOS memory cell which allows for programming and erasing by tunneling through the gate oxides of the PMOS and NMOS transistors. A capacitor has a first terminal coupled to a common floating gate of the PMOS and NMOS transistors and a second terminal coupled to a control gate node. A separate pass transistor has its gate coupled to a word line node, its drain coupled to an erase line node, and its source coupled to the control gate node.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 3:
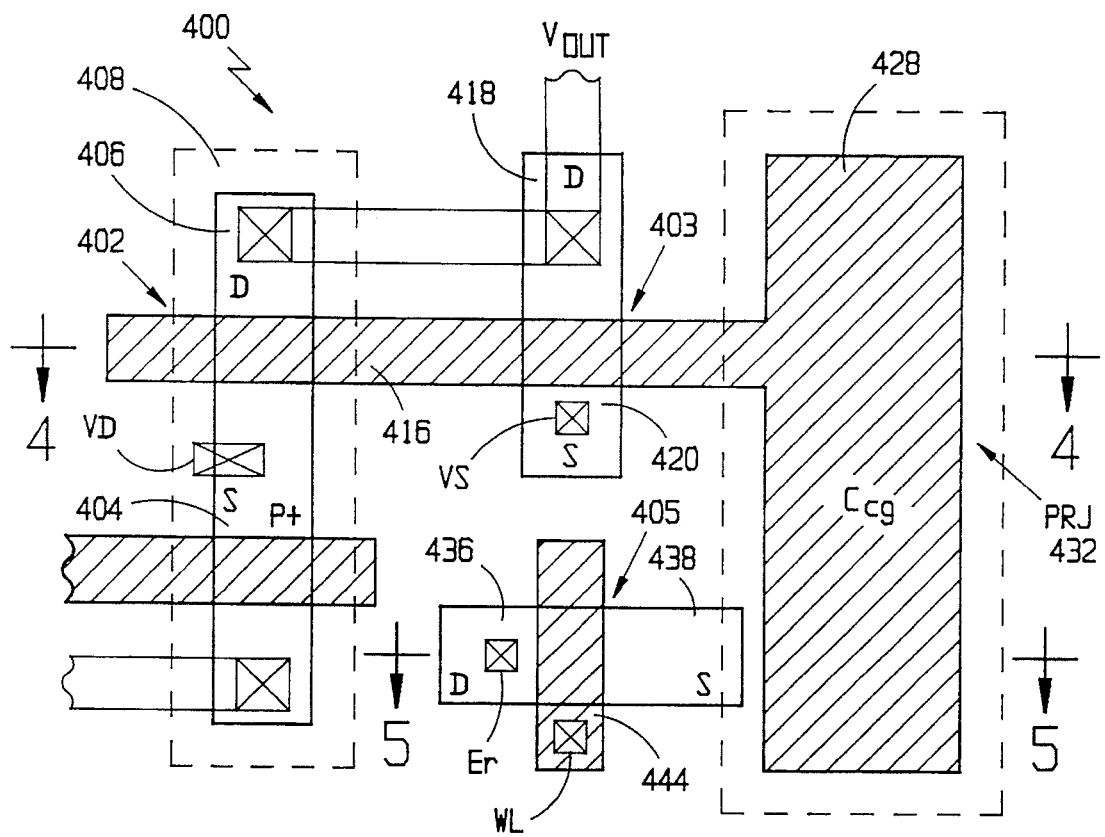
FIG. 3 is a top plan view of a layout for a control gate-addressed CMOS memory cell, constructed in accordance with the principles of the present invention.
Figure 4:
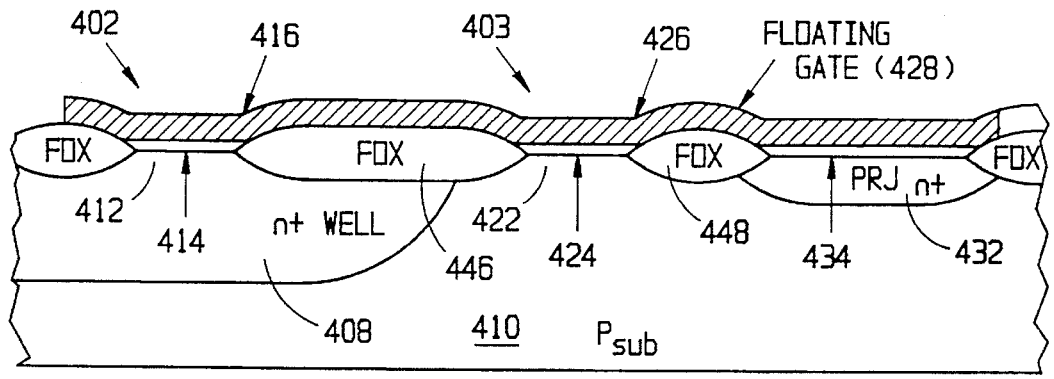
FIG. 4 is a cross-sectional view, taken along the lines 4—4 of FIG. 3.
Figure 5:
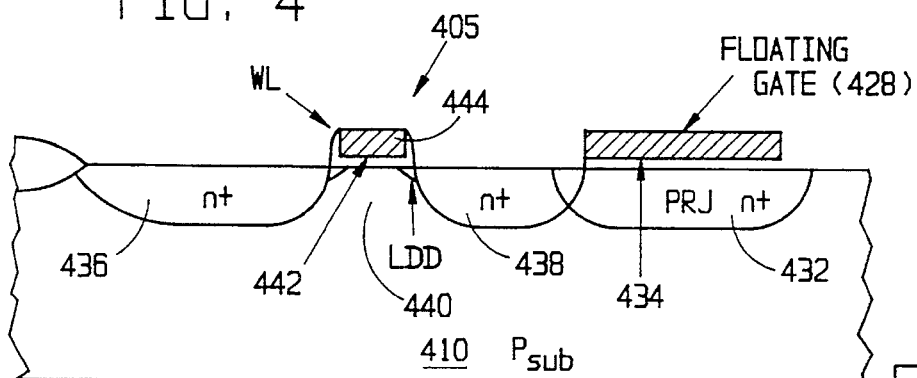
FIG. 5 is a cross-sectional view, taken along the lines 5—5 of FIG. 3.

Referring now to FIG. 3 of the drawings, there is shown a top plan view of a layout for an improved control gate-addressed CMOS memory cell 400 constructed in accordance with the principles of the present invention. FIG. 4 is a cross-sectional view taken along the lines 4—4 of FIG. 3, and FIG. 5 is a cross-sectional view taken along the lines 5—5 of FIG. 3. As fabricated, a PMOS transistor 402 is formed with p+ source region 404 and p+ drain region 406 diffused in an n+ type well region 408, which is formed within a p type substrate 410. A channel region 412 is formed between the regions 404 and 406 and is beneath a gate oxide layer 414 of approximately 80 Å in thickness. An N-type polycrystalline silicon floating gate (poly-Si) 416 overlies the gate oxide layer 414.

An NMOS transistor 403 is formed with n+ drain region 418 and n+ source region 420 in the p type substrate 410. A channel region 422 is formed between the regions 418 and 420 and is beneath a gate oxide layer 424 of approximate 80 Å in thickness. The floating gate 416 extends across to the NMOS transistor 403 so as to form a floating gate 426 which overlies the gate oxide layer 424.

The floating gate 426 also extends from the NMOS transistor 403 to an enlarged area 428 in order to form a gate capacitor 430 having a capacitance $C_{cg}$. An n+ programmable junction (PRJ) region 432 is provided in the p type substrate 410. Overlying the PRJ region 432 is a gate oxide layer 434 of approximately 80 Å in thickness. The common floating gate 416 (426, 428) is disposed above the gate oxide layer 434.

Further, an NMOS pass transistor 405 is formed with n+ drain region 436 and n+ source region 438 in the p type substrate 410. A channel region 440 is formed between the regions 436 and 438 and is beneath a gate oxide layer 442 of approximately 50 Å in thickness. A polysilicon gate 444 overlies the gate oxide layer 442. A word line (WL) is connected to the polysilicon gate 444 of the pass transistor 405. An erase line (Er) is connected to the drain 436 of the pass transistor 405. The source of the pass transistor 405 is connected to the PRJ region 432, which is capacitively coupled to the floating gate of the transistors 402 and 403 via the gate oxide layer 434. A first power supply line VD is connected to the source of the PMOS transistor 402, and a second power supply line VS is connected to the source of the NMOS transistor 403. An output or load line $V_{out}$ is connected via node 417 to the common drains of the PMOS and NMOS transistors 402 and 403.

As can best be seen from FIG. 4, a field oxide layer 446 insulates the floating gate 416 from the underlying p type substrate 410 separating the PMOS transistor 402 and the NMOS transistor 403. Also, a field oxide layer 448 insulates the floating gate 426 from the substrate 410 separating the NMOS transistor 403 and the programming junction (PRJ) region 432.

Figure 1:
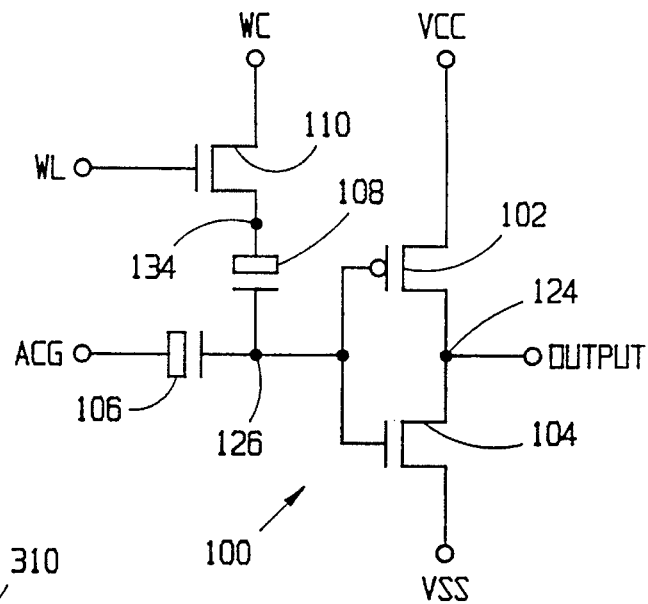
FIG. 1 is a schematic circuit diagram of a prior art CMOS memory cell.
Figure 2:
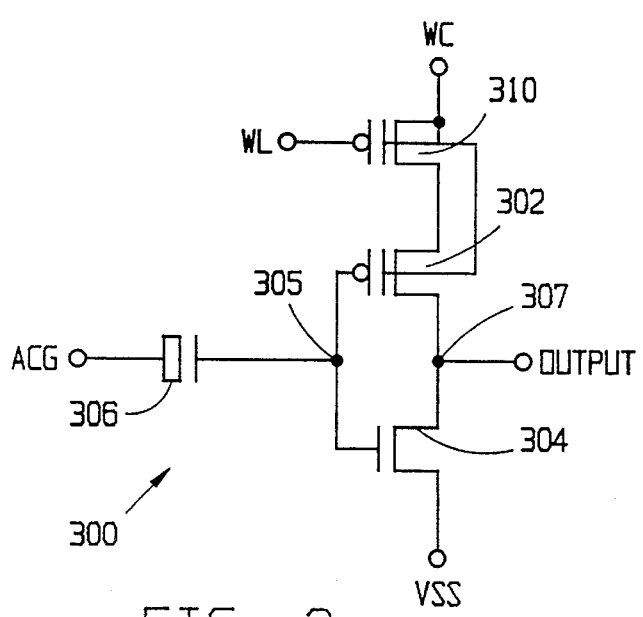
FIG. 2 is a schematic circuit diagram of a second prior art CMOS memory cell.
Figure 6:
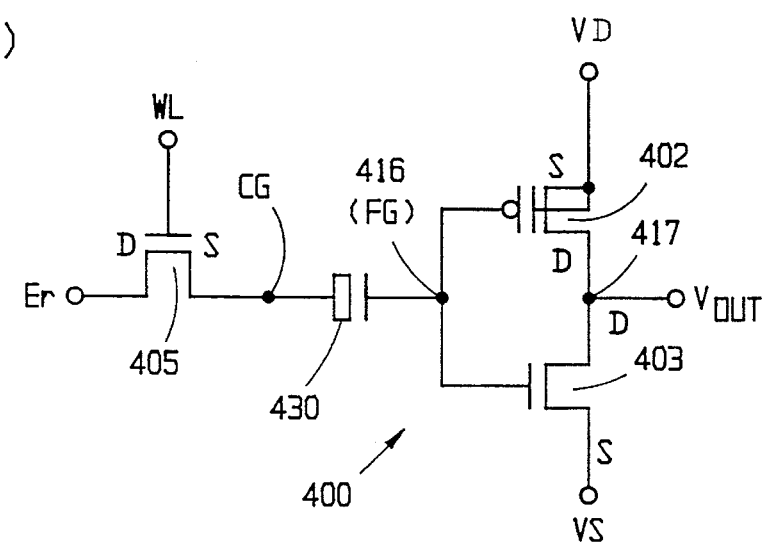
FIG. 6 is a schematic circuit diagram of the present control gate-addressed CMOS memory cell of FIG. 3.

In FIG. 6, there is shown a schematic circuit diagram of the control gate-addressed CMOS memory cell 400 of the present invention. It will be noted that the word line WL is connected to the control gate of the pass transistor 405 and that the erase line Er is connected to the drain of the pass transistor 405. The gate oxide layer 434 formed between the floating gate 428 (node 416) and the programming junction (PRJ) region 428 is represented by a capacitor 430 having a capacitance $C_{cg}$ interconnected between the source of the pass transistor 405 and the node 416. The drain and source electrodes of the PMOS transistor 402, NMOS transistor 403, and pass transistor 405 are all designated by legends D and S, respectively. The operation of the CMOS memory cell 400 will now be described with reference to FIGS. 3 through In the Table listed below, there is shown the various voltages applied to the circuit diagram of FIG. 6 in order to effect the three operations of the CMOS memory cell 400, which are program (write), erase and read. Programming indicates that electrons are being removed from the common floating gate, and erase indicates that electrons are being added to the common floating gate.

TABLE

|  | WL | Er | VD | VS |
|---|---|---|---|---|
| (erase) | E: 13.8 v | 12.0 v | HiZ | 0 v |
| (program) | P: VCC | 0 v | 12.0 v | HiZ |
| (read) | R: VCC | VCC/2 | VCC | 0 v |

When the N-type poly-Si floating gate 416 is written upon or programmed, the floating gate is given a positive charge by removing (discharging) electrons from the floating gate. In order to perform this function, a first word line voltage VCC of approximately +5.0 volts is applied to the word line WL, the erase line Er is grounded, and a high programming voltage of approximately +12.0 volts is applied to the first power supply line VD. The second power supply line VS has applied thereto a high impedance. Thus, the pass transistor 405 will be turned on and the voltage on the erase line Er (being at zero volts) applied to its drain will be coupled to the source at a control gate node CG. Since the high voltage of +12.0 volts is applied to the source of the PMOS transistor 402, electrons will tunnel from the floating gate (FG) node to the source of the PMOS transistor 402 through the gate oxide layer 414. As a result, a net positive charge is maintained on the floating gate 416.

In order to erase the floating gate 416, a high erase voltage of approximately +13.8 volts is applied to the word line WL, a voltage of +5.0 volts is applied to the erase line Er, and a high impedance is applied to the first power supply line VD. The second power supply line VS is grounded. Under this biasing condition, the pass transistor 405 will again be turned on, causing the voltage of +5.0 volts applied to its drain to be coupled to its source at the control node CG. Since the source of the NMOS transistor 403 is applied with zero volts, this will cause the electrons to tunnel in the reverse direction across the gate oxide layer 424 to the floating gate (FG) node from the source of the NMOS transistor 403.

For reading the state of the CMOS memory cell 400, a regulated voltage of VCC (which is typically at +5.0 volts) is applied to the word line WL and to the first power supply line VD. It is desired that the voltage VCC be regulated so as to improve data retention performance against variations in the power supply voltage. A voltage of VCC/2, which is approximately +2.5 volts in the present embodiment, is applied to the erase line Er. The second power supply line VS is grounded. Under this condition, the pass transistor 405 will be turned on, and therefore, the voltage at the control gate node CG will also be at +2.5 volts. Since the first power supply line VD is at +5.0 volts and the second power supply line is at zero volts, the voltage at the floating gate 416 will also be at +2.5 volts so as to avoid a floating read disturb condition. If the floating gate 416 is storing a positive charge (programmed), the PMOS transistor 402 will be turned off and the NMOS transistor 403 will be turned on. Consequently, the output node $V_{out}$ will go to a low state (zero volts). On the other hand, if the floating gate 416 is storing a negative charge (erased), the NMOS transistor 403 will be turned off and the PMOS transistor 402 will be turned on. As a result, the output node $V_{out}$ will be pulled to a high state (+5.0 volts).

The CMOS memory cell 400 of the present invention has the following advantages over the prior art:

(a) it has eliminated the use of a second capacitor with a tunnel oxide region, thereby enabling an overall reduction in the memory cell size;

(b) it has eliminated the use of any programming junction region beneath the thin tunnel oxide layer overlying the channel of the respective PMOS and NMOS transistors in order to provide a better oxide quality; and (c) it has eliminated the potential deep depletion related disturb problem.

From the foregoing detailed description, it can thus be seen that the present invention provides an improved control gate-addressed CMOS memory cell which allows for programming and erasing by tunneling through the gate oxides of the PMOS and NMOS transistors. A capacitor has a first terminal coupled to a common floating gate of the PMOS and NMOS transistors and has a second terminal coupled to a control gate node. A separate pass transistor has its gate coupled to a word line, its drain coupled to an erase line, and its source coupled to the control gate node.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A non-volatile memory cell comprising:

a common floating gate (416);

an ouput node ($V_{out}$);

a control gate node (CG);

a P-channel MOS transistor (402) having its source coupled to a first power supply line (VD), its drain coupled to said output node, and its gate coupled to said common floating gate;

an N-channel MOS transistor (403) having its drain coupled to the drain of said P-channel MOS transistor and to said output node, its source coupled to a second power supply line (VS), and its gate coupled to said common floating gate;

a capacitor (430) having a first terminal coupled to said common floating gate and a second terminal coupled to said common gate node;

a pass transistor (405) having its gate coupled to a word line (WL), its drain coupled to an erase line (ER), and its source coupled to said control gate node; and a high voltage being applied to the first power supply line, a first word line voltage that is less than the high voltage being applied to said word line, a ground potential being applied to said erase line, and a high impedance being applied to the second power supply line so that electrons are transferred from said common floating gate to the source of said PMOS transistor (402) via said first gate oxide layer (414) during a programming mode.

2. A non-volatile memory cell as claimed in claim 1, wherein said pass transistor is comprised of an N-channel MOS transistor.

3. A non-volatile memory cell as claimed in claim 1, wherein said source and drain of said P-channel MOS transistor (402) is formed of first and second p+ regions (404, 406) within an n+ well region (408) of a p type substrate (410).

4. A non-volatile memory cell as claimed in claim 3, wherein said drain and source of said N-channel MOS transistor (403) is formed of first and second n+ regions (418, 420) in said p type substrate (410), said second p+ region (406) forming the drain of said P-channel MOS transistor (402) being connected to the first n+ region (418) forming the drain of said N-channel MOS transistor (403).

5. A non-volatile memory cell as claimed in claim 4, further comprising a first channel (412) formed between said first and second p+ regions (404, 406) and a first gate oxide layer (414) overlying said first channel, said common floating gate (416) overlying said first gate oxide layer.

6. A non-volatile memory cell as claimed in claim 5, wherein said first gate oxide layer (414) has a thickness of approximately 80 Å.

7. A non-volatile memory cell as claimed in claim 6, further comprising a second channel (422) formed between said first and second n+ regions (418, 420) and a second gate oxide layer (424) overlying said second channel, said common floating gate (416) also overlying said second gate oxide layer.

8. A non-volatile memory cell as claimed in claim 7, wherein said second gate oxide layer (424) has a thickness of approximately 80 Å.

9. A non-volatile memory cell as claimed in claim 1, wherein during an erase mode a second high voltage is applied to the word line, an erase voltage substantially equal to said second high word line voltage is applied to said erase line, and a high impedance is applied to said first power supply line, said second power supply line being connected to the ground potential, so that electrons are transferred to said common floating gate from the source of said NMOS transistor (403) via said second gate oxide layer (424).

10. A non-volatile memory cell comprising:

a common floating gate (416);

a control gate node (CG);

a capacitor (430) having first terminal coupled to said floating gate and a second terminal coupled to said control gate node;

a PMOS transistor (402) having its source coupled to a first power supply line (VD), its drain coupled to an output node, a first channel (412) formed between said source and drain, a first gate oxide layer (414) overlying said first channel, and said common floating gate overlying said first gate oxide layer;

an NMOS transistor (403) having its drain coupled to the drain of said PMOS transistor and to said output node, its source coupled to a second power supply line (VS), a second channel (422) formed between said source and drain, a second gate oxide layer (424) overlying said second channel, and said common floating gate overlying said second gate oxide layer;

an NMOS pass transistor (405) having its gate coupled to a word line, its drain coupled to an erase line, and its source coupled to said control gate node; and a high voltage being applied to the first power supply line, a first word line voltage that is less than the high voltage being applied to said word line, a ground potential being applied to said erase line, and a high impedance being applied to the second power supply line so that electrons are transferred from said common floating gate to the source of said PMOS transistor (402) via said first gate oxide layer (414) during a programming mode.

11. A non-volatile memory cell as claimed in claim 10, wherein said pass transistor is comprised of an N-channel MOS transistor.

12. A non-volatile memory cell as claimed in claim 10, wherein said source and drain of said P-channel MOS transistor (402) is formed of first and second p+ regions (404, 406) within an n+ well region (408) of a p type substrate (410).

13. A non-volatile memory cell as claimed in claim 12, wherein said drain and source of said N-channel MOS transistor (403) is formed of first and second n+ regions (418, 420) in said p type substrate (410), said second p+ region (406) forming the drain of said P-channel MOS transistor (402) being connected to the first n+ region (418) forming the drain of said N-channel MOS transistor (403).

14. A non-volatile memory cell as claimed in claim 13, wherein said first gate oxide layer (414) has a thickness of approximately 80 Å.

15. A non-volatile memory cell as claimed in claim 14, wherein said second gate oxide layer (424) has a thickness of approximately 80 Å.

16. A non-volatile memory cell as claimed in claim 10, wherein during an erase mode a second high voltage is applied to the word line, an erase voltage substantially equal to said second high word line voltage is applied to said erase line, and a high impedance is applied to said first power supply line, said second power supply line being connected to the ground potential, so that electrons are transferred to said common floating gate from the source of said NMOS transistor (403) via said second gate oxide layer (424).

17. A non-volatile memory cell as claimed in claim 13, wherein said drain and source of said NMOS pass transistor (405) is formed of third and fourth n+ regions (436, 438) in said substrate (410).

18. A non-volatile memory cell as claimed in claim 17, further comprising a third channel (440) formed between said third and fourth n+ regions (436, 438) and a third gate oxide layer (442) overlying said third channel.

* * * * *